US009165960B2

(12) United States Patent
Tai et al.

(10) Patent No.: US 9,165,960 B2
(45) Date of Patent: Oct. 20, 2015

(54) PIXEL CIRCUIT, ACTIVE SENSING ARRAY, SENSING DEVICE AND DRIVING METHOD THEREOF

(71) Applicant: Industrial Technology Research Institute, Hsinchu (TW)

(72) Inventors: Ya-Hsiang Tai, Hsinchu (TW);
Bo-Cheng Chen, Keelung (TW);
Lu-Sheng Chou, Kaohsiung (TW);
Bo-Wen Xiao, Taoyuan County (TW);
Heng-Yin Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 106 days.

(21) Appl. No.: 13/913,521

(22) Filed: Jun. 10, 2013

(65) Prior Publication Data
US 2014/0192035 A1    Jul. 10, 2014

(30) Foreign Application Priority Data
Jan. 4, 2013    (TW) .............................. 102100298 A

(51) Int. Cl.
| | |
|---|---|
| G06F 3/038 | (2013.01) |
| G09G 5/00 | (2006.01) |
| H01L 27/146 | (2006.01) |
| H04N 5/32 | (2006.01) |
| H04N 5/365 | (2011.01) |
| H04N 5/378 | (2011.01) |

(52) U.S. Cl.
CPC .... *H01L 27/14609* (2013.01); *H01L 27/14643* (2013.01); *H04N 5/32* (2013.01); *H04N 5/3653* (2013.01); *H04N 5/378* (2013.01)

(58) Field of Classification Search
CPC .............................................. G09G 2330/043

USPC ................................................... 345/207, 101
See application file for complete search history.

(56) References Cited

U.S. PATENT DOCUMENTS

| | | | |
|---|---|---|---|
| 5,331,179 | A | 7/1994 | Lee et al. |
| 5,369,268 | A | 11/1994 | Van Aller et al. |

(Continued)

FOREIGN PATENT DOCUMENTS

TW          201213838           4/2012

OTHER PUBLICATIONS

Nader Safavian, et al., "Investigation of Gain Non-uniformities in the Two TFT, Current Programmed Amorphous Silicon Active Pixel Sensor for Fluoroscopy, Chest Radiography and Mammography Tomosynthesis Applications", Proc. of SPIE, vol. 7622, Feb. 2010, pp. 76221N-1-76221N-8.

(Continued)

*Primary Examiner* — Long D Pham
(74) *Attorney, Agent, or Firm* — Jianq Chyun IP Office

(57) ABSTRACT

A pixel circuit, an active sensing array, a sensing device, and a driving method thereof are provided. The pixel circuit includes a sensing transistor, a reset transistor, and a storage capacitor. The sensing transistor is electrically connected to a sensing element and a data line. The reset transistor is electrically connected to a first scan line and the sensing transistor. The storage capacitor is electrically connected to the sensing transistor and a second scan line. During a compensation period, the reset transistor is turned on in response to a first scanning pulse from the first scan line, so that the sensing transistor is connected into a diode configuration, and the storage capacitor charges and discharges to a threshold voltage of the sensing transistor through the sensing transistor having the diode configuration in response to switching of a level of the data line.

34 Claims, 7 Drawing Sheets

(56) References Cited

U.S. PATENT DOCUMENTS

| | | |
|---|---|---|
| 6,380,543 B1 | 4/2002 | Kim |
| 6,677,616 B2 | 1/2004 | Kim |
| 7,012,259 B2 | 3/2006 | Nam et al. |
| 7,524,711 B2 | 4/2009 | Lan |
| 7,633,091 B2 | 12/2009 | Lan |
| 7,728,329 B2 | 6/2010 | Joo et al. |
| 7,791,080 B2 | 9/2010 | Hsiao et al. |
| 8,324,624 B2 | 12/2012 | Jung |
| 2008/0135895 A1* | 6/2008 | Lee et al. .................. 257/290 |
| 2008/0302969 A1 | 12/2008 | Jung et al. |
| 2009/0219277 A1* | 9/2009 | Teranishi et al. .......... 345/214 |
| 2010/0140455 A1 | 6/2010 | Nathan et al. |
| 2011/0096049 A1* | 4/2011 | Katoh et al. .............. 345/207 |
| 2011/0187906 A1* | 8/2011 | Chaji et al. ............... 348/300 |

OTHER PUBLICATIONS

Nader Safavian, et al., "TFT active image sensor with Current-Mode Readout Circuit for Digital X-ray Fluoroscopy", Proc. of SPIE, vol. 5969, Sep. 2005, pp. 596929-1-596929-9.

Farhad Taghibakhsh, et al., "Evaluation of the X-Ray Response of Amorphous Selenium Coated 100 micron pitch a-Si Active Pixel Sensors for Tomosynthesis Applications", Proc. of SPIE, vol. 7258, Jan. 1, 2009, pp. 72581H-1-72581H-9.

N. Safavian, et al., "A novel current scaling active pixel sensor with correlated double sampling readout circuit for real time medical x-ray imaging", IEEE, International Symposium on Circuits and Systems (ISCAS), May 27-30, 2007, pp. 93-96.

Karim S. Karim, et al., "Amorphous Silicon Active Pixel Sensor Readout Circuit for Digital Imaging", IEEE, Transactions on Electron Devices, vol. 50, No. 1, Jan. 2003, pp. 200-208.

N. Safavian, et al., "Threshold voltage shift compensated active pixel sensor array for digital X-ray imaging in a-Si technology", Electronics Letters, vol. 41 No. 7, Mar. 1, 2005, pp. 411-412.

Lu-Sheng Chou, et al., "Active Photo-Sensing Array of Thin Film Transistor with Threshold Voltage Compensation", IDW/AD '12, The 19th International Display Workshops in conjunction with Asia Display, Dec. 30, 2012, pp. 829-832.

* cited by examiner

PIXEL CIRCUIT, ACTIVE SENSING ARRAY, SENSING DEVICE AND DRIVING METHOD THEREOF

CROSS-REFERENCE TO RELATED APPLICATION

This application claims the priority benefit of Taiwan application serial no. 102100298, filed on Jan. 4, 2013. The entirety of the above-mentioned patent application is hereby incorporated by reference herein and made a part of this specification.

TECHNICAL FIELD

The technical field relates to a sensing technique, and more particularly, to a sensing device and a pixel circuit, an active sensing array, and a driving method thereof.

BACKGROUND

Along with the development of optoelectronic technology, sensing devices have been broadly applied to different technical fields, such as optical image sensors, digital radiography sensors (DRS), and touch screen sensors. A sensing device is mainly composed of an active sensing array, and the active sensing array includes a plurality of pixel circuits.

In order to meet the high security demand, a sensing device is designed to have high sensitivity, so that the pixel circuit can detect incident energy of low-dose radiation. Besides, in order to meet the demand for high resolution, the area of a single pixel circuit is relatively reduced, and accordingly the photosensitive area of a sensing element in the pixel circuit is reduced. It should be noted that the intensity of an electric signal generated by the pixel circuit is drastically reduced with the decrease in the radiation dose of the incident energy and the photosensitive area of the sensing element.

The characteristic differences between transistors in the pixel circuit become obvious and can not be neglected due to the weak electric signal. For example, the threshold voltage of each transistor changes with process variation. Besides, when the transistors have different threshold voltages, different sensing results will be produced even though the same incident energy is supplied to each pixel circuit. As a result, sensing errors will be produced.

To resolve the problem mentioned above, some techniques for compensating the threshold voltages of the transistors in a pixel circuit have been developed, such as the "Investigation of gain non-uniformities in the two TFT, current programmed amorphous silicon active pixel sensor for fluoroscopy, chest radiography and mammography tomosynthesis applications" published by N. Safavian et al. in volume 7622 of proceedings of SPIE and the "TFT active image sensor with current-mode readout circuit for digital x-ray fluoroscopy" published by N. Safavian et al. in volume 5969 of proceedings of SPIE.

The technique provided by N. Safavian et al. in the volume 7622 of the proceedings of SPIE cannot provide regional compensation or one-time compensation to the pixel circuits (i.e., cannot effectively compensate each pixel circuit in an active sensing array). Additionally, the pixel circuit disclosed by N. Safavian in the volume 5969 of the proceedings of SPIE has a 3-transistor (3T) structure. Thus, the pixel circuit has a large layout area therefore can only be applied to low-resolution sensing devices.

Thereby, how to eliminate the sensing errors caused by the characteristic differences between different elements when the resolution and sensitivity of a sensing device are improved has become a major subject in the design of sensing devices.

SUMMARY

The disclosure provides a pixel circuit, an active sensing array, a sensing device, and a driving method thereof, in which sensing error caused by characteristic differences between different elements is avoided at the same when the resolution and sensitivity of the sensing device are improved.

The disclosure provides a pixel circuit. The pixel circuit is electrically connected to a first scan line, a second scan line, and a data line and includes a sensing transistor, a reset transistor, and a storage capacitor. The sensing transistor is electrically connected to a sensing element, and the data line. The reset transistor is electrically connected to the first scan line and the sensing transistor. The storage capacitor is electrically connected to the sensing transistor and the second scan line. During a compensation period, the reset transistor is turned on in response to a first scanning pulse from the first scan line, so that the sensing transistor is connected into a diode configuration, and the storage capacitor charges and discharges to a threshold voltage of the sensing transistor through the sensing transistor having the diode configuration in response to switching of a level of the data line.

The disclosure provides a driving method of a pixel circuit. The pixel circuit includes a sensing transistor, a reset transistor, and a storage capacitor. The driving method includes following steps. A data line, a first scan line, and a second scan line are configured to electrically connect the pixel circuit. Wherein, the sensing transistor is electrically connected to a sensing element and the data line, the reset transistor is electrically connected to the first scan line and the sensing transistor, and the storage capacitor is electrically connected to the sensing transistor and the second scan line. During a compensation period, a first scanning pulse is provided to the first scan line to turn on the reset transistor. The sensing transistor is connected into a diode configuration through the turned-on reset transistor. The level of the data line is switched so that the storage capacitor charges and discharges to a threshold voltage of the sensing transistor through the sensing transistor having the diode configuration.

The disclosure provides an active sensing array. The active sensing array includes M pixel rows. The M pixel rows are corresponding to M first scan lines, M second scan lines, and a plurality of data lines. An $i^{th}$ pixel row is electrically connected to an $i^{th}$ first scan line, an $i^{th}$ second scan line, and the data lines, where M is a positive integer, i is an integer, and $1 \leq i \leq M$. The $i^{th}$ pixel row includes a plurality of pixel circuits, and each pixel circuit of the $i^{th}$ pixel row includes a sensing transistor, a reset transistor, and a storage capacitor. The sensing transistor is electrically connected to a sensing element and one of the data lines. The reset transistor is electrically connected to the $i^{th}$ first scan line and the sensing transistor. The storage capacitor is electrically connected to the sensing transistor and the $i^{th}$ second scan line. During a compensation period, the reset transistors of the $1^{st}$ to the $N^{th}$ pixel rows are turned on in response to N first scanning pulses from the $1^{st}$ to the $N^{th}$ first scan lines, so that the sensing transistors of the $1^{st}$ to the $N^{th}$ pixel rows are respectively connected into a diode configuration, where N is an integer not greater than M. Besides, during the compensation period, the storage capacitors of the $1^{st}$ to the $N^{th}$ pixel rows charge and discharge to threshold voltages of the sensing transistors having the diode configuration of the $1^{st}$ to the $N^{th}$ pixel rows through the sensing transistors having the diode configuration in response to switching of levels of the data lines.

The disclosure provides a driving method of an active sensing array. The active sensing array includes M pixel rows, an $i^{th}$ pixel row includes a plurality of pixel circuits, and each pixel circuit includes a sensing transistor, a reset transistor, and a storage capacitor, where M is a positive integer, i is an integer, and $1 \leq i \leq M$. The driving method includes following steps. M first scan lines, M second scan lines, and a plurality of data lines are configured to electrically connect the M pixel rows, wherein the $i^{th}$ pixel row is electrically connected to an $i^{th}$ first scan line, an $i^{th}$ second scan line, and the data lines. During a compensation period, N first scanning pulses are provided to the $1^{st}$ to the $N^{th}$ first scan lines to turn on the reset transistors of the $1^{st}$ to the $N^{th}$ pixel rows, where N is an integer not greater than M. The sensing transistors of the $1^{st}$ to the $N^{th}$ pixel rows are respectively connected into a diode configuration through the turned-on reset transistors of the $1^{st}$ to the $N^{th}$ pixel rows. The levels of the data lines are switched so that the storage capacitors of the $1^{st}$ to the $N^{th}$ pixel rows charge and discharge to threshold voltages of the sensing transistors having the diode configuration through the sensing transistors having the diode configuration.

The disclosure provides a sensing device. The sensing device includes at least one sensing element and an active sensing array. The active sensing array includes at least one pixel circuit. The at least one pixel circuit is electrically connected to a first scan line, a second scan line, and a data line and includes a sensing transistor, a reset transistor, and a storage capacitor. The sensing transistor is electrically connected to the at least one sensing element and the data line. The reset transistor is electrically connected to the first scan line and the sensing transistor. The storage capacitor is electrically connected to the sensing transistor and the second scan line. During a compensation period, the reset transistor is turned on in response to a first scanning pulse from the first scan line, so that the sensing transistor is connected into a diode configuration, and the storage capacitor charges and discharges to a threshold voltage of the sensing transistor through the sensing transistor having the diode configuration in response to switching of a level of the data line.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
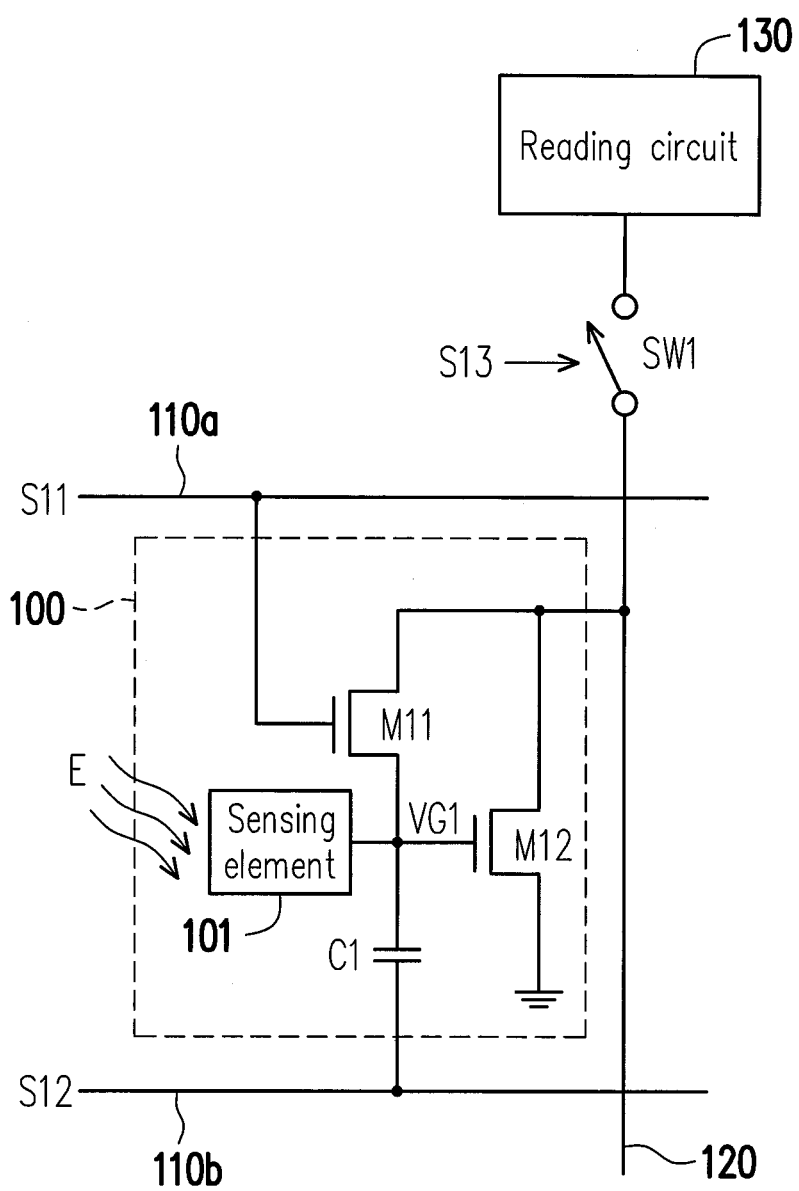
FIG. 1A is a diagram of a pixel circuit according to an exemplary embodiment of the disclosure.

FIG. 1A is a diagram of a pixel circuit according to an exemplary embodiment of the disclosure. Referring to FIG. 1A, the pixel circuit 100 is electrically connected to a first scan line 110a, a second scan line 110b, and a data line 120 and includes a reset transistor M11, a sensing transistor M12, and a storage capacitor C1. The sensing transistor M12 is electrically connected to a sensing element 101 and the data line 120. The reset transistor M11 is electrically connected to the first scan line 110a and the sensing transistor M12. The storage capacitor C1 is electrically connected to the sensing transistor M12 and the second scan line 110b.

Figure 1B:
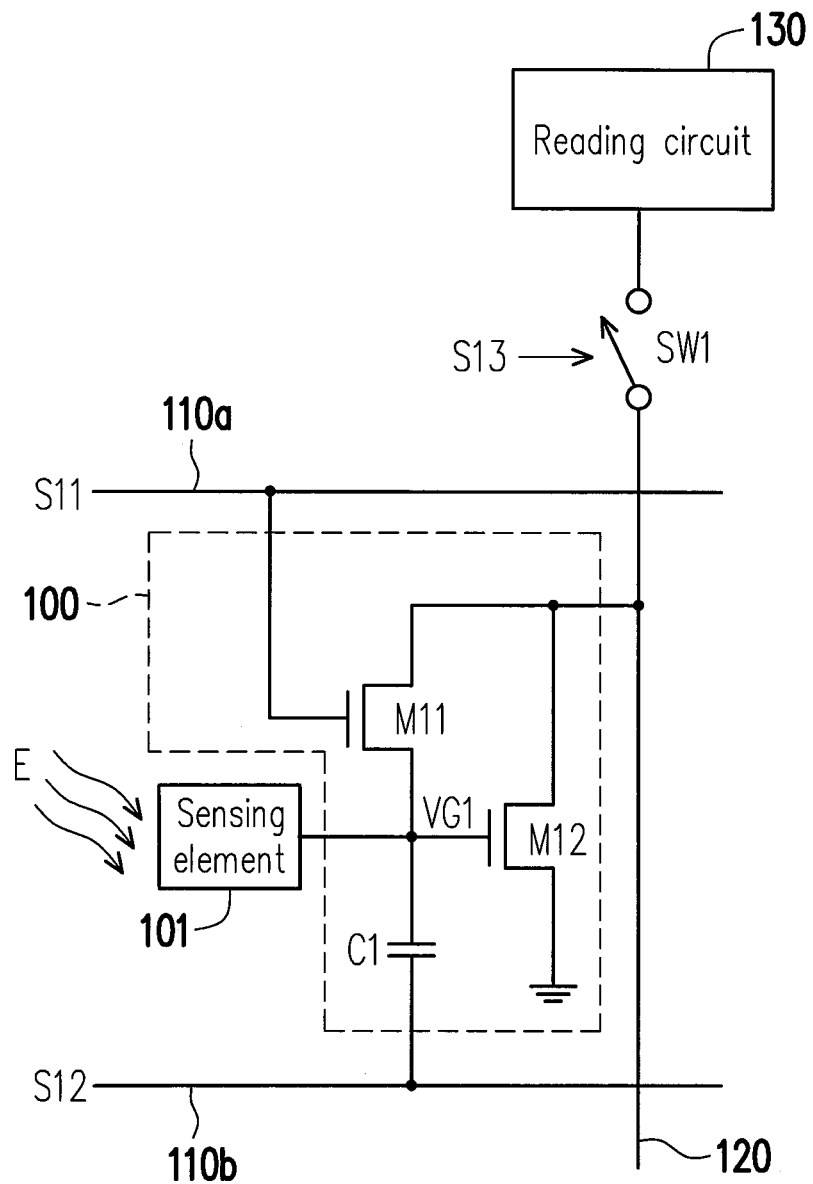
FIG. 1B is a diagram of a pixel circuit according to another exemplary embodiment of the disclosure.

In the embodiment illustrated in FIG. 1A, the sensing element 101 is disposed in the pixel circuit 100. Even though the embodiment illustrated in FIG. 1A demonstrates the disposition of the sensing element 101, it is not intended to limit the scope of the disclosure. FIG. 1B is a diagram of a pixel circuit according to another exemplary embodiment of the disclosure. As shown in FIG. 1B, the sensing element 101 is disposed outside the pixel circuit 100. In other words, those skilled in the art can dispose the sensing element 101 inside or outside the pixel circuit 100 according to the design requirement. Additionally, in yet another embodiment, the sensing element 101 may also be stacked on the pixel circuit 100.

In an actual application, the reset transistor M11 and the sensing transistor M12 may be bipolar junction transistors (BJT), metal oxide semiconductor (MOS) transistors, or any other type of transistors. For example, in the embodiment illustrated in FIG. 1A, the reset transistor M11 and the sensing transistor M12 are composed of N-channel metal oxide semiconductor (NMOS) transistors. Thus, regarding the structure detail of the pixel circuit 100 in FIG. 1A, the sensing transistor M12 and the reset transistor M11 respectively include a first terminal (for example, drain), a second terminal (for example, source), and a control terminal (for example, gate).

The first terminal of the sensing transistor M12 is electrically connected to the data line 120, the second terminal of the sensing transistor M12 is electrically connected to a ground, and the control terminal of the sensing transistor M12 is electrically connected to the sensing element 101. The first terminal of the reset transistor M11 is electrically connected to the first terminal of the sensing transistor M12, the second terminal of the reset transistor M11 is electrically connected to the control terminal of the sensing transistor M12, and the control terminal of the reset transistor M11 is electrically connected to the first scan line 110a. Besides, a first end of the storage capacitor C1 is electrically connected to the control terminal of the sensing transistor M12, and the second end of the storage capacitor C1 is electrically connected to the second scan line 110b.

The pixel circuit 100 senses an incident energy E. The corresponding sensing result can be read through a reading circuit 130. The reading circuit 130 is electrically connected to the data line 120 through a switch SW1. It should be noted that in order to eliminate the sensing errors caused by characteristic differences between different elements, the pixel circuit 100 first compensates the threshold voltages of transistors during a compensation period. Then, the pixel circuit 100 senses the incident energy E during a sensing period and generates a corresponding sensing current during a reading period.

Figure 2:
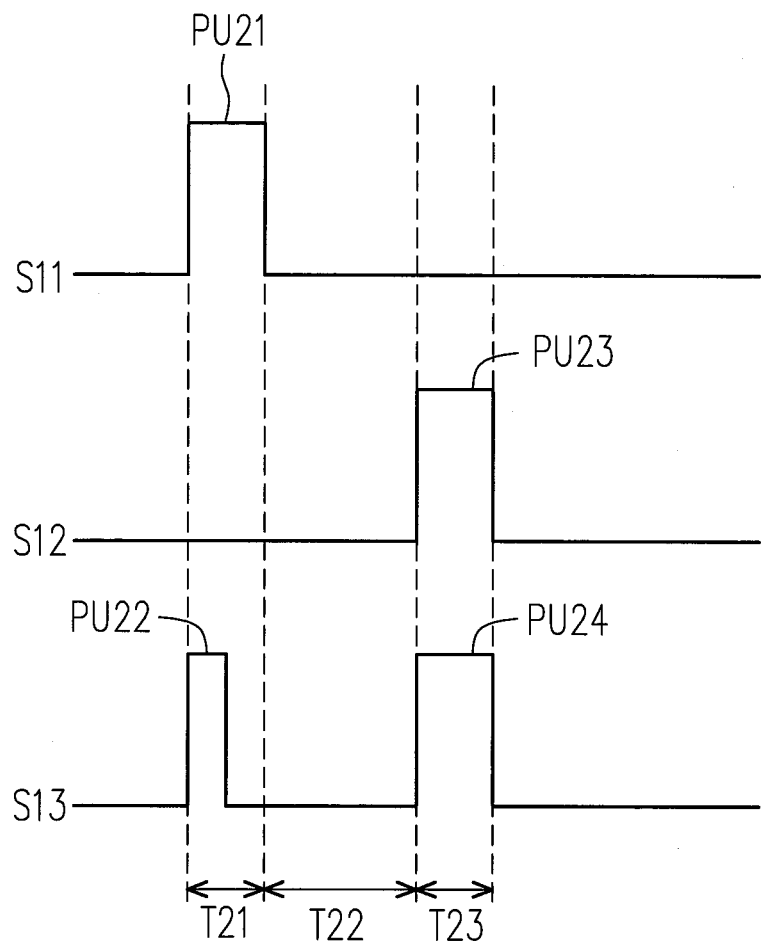
FIG. 2 is a signal timing diagram for illustrating a pixel circuit according to an exemplary embodiment of the disclosure.

An embodiment of the disclosure will be described with reference to FIG. 2 in order to allow those skilled in the art to better understand the disclosure. FIG. 2 is a signal timing diagram for illustrating a pixel circuit according to an exemplary embodiment of the disclosure. Below, the operation details of the pixel circuit 100 will be explained with reference to both FIG. 1A and FIG. 2. In FIG. 1A and FIG. 2, the reference numeral S11 represents a signal transmitted to the first scan line 110a, the reference numeral S12 represents a signal transmitted to the second scan line 110b, and the reference numeral S13 represents a signal for controlling the switch SW1.

As shown in FIG. 1A and FIG. 2, during a compensation period T21, the reset transistor M11 receives a first scanning pulse PU21 from the first scan line 110a. Thus, the reset transistor M11 is turned on in response to the first scanning pulse PU21. When the reset transistor M11 is turned on, the first terminal and the control terminal of the sensing transistor M12 are electrically connected with each other, so that the sensing transistor M12 is connected into a diode configuration. Besides, during the first half period for transmitting the first scanning pulse PU21, the switch SW1 receives a pulse PU22 and accordingly is turned on. Moreover, when the switch SW1 is turned on, the level of the data line 120 is maintained at a bias voltage through the reading circuit 130. Thus, the bias voltage from the data line 120 charges the storage capacitor C1 through the sensing transistor M12 having the diode configuration until the storage capacitor C1 is charged to the bias voltage. Namely, during the first half transmission period of the first scanning pulse PU21, the voltage VG1 at the control terminal of the sensing transistor M12 increases to the bias voltage.

On the other hand, during the second half period for transmitting the first scanning pulse PU21, the switch SW1 does not receive any pulse and therefore is turned off. In addition, since the switch SW1 is turned off, the data line 120 is maintained in a floating state. Thus, the storage capacitor C1 discharges through the sensing transistor M12 having the diode configuration, so that the voltage VG1 at the control terminal of the sensing transistor M12 gradually decreases. It should be noted that when the voltage VG1 decreases to the threshold voltage of the sensing transistor M12, the sensing transistor M12 is automatically turned off, so that the storage capacitor C1 stops discharging. Namely, during the second half transmission period of the first scanning pulse PU21, the storage capacitor C1 discharges to the threshold voltage of the sensing transistor M12.

In other words, during the compensation period T21, the reset transistor M11 is turned on in response to the first scanning pulse PU21 from the first scan line 110a, so that the sensing transistor M12 is connected into the diode configuration. On the other hand, the data line 120 is sequentially switched to the bias voltage and the floating state along with the turn-on and turn-off the switch SW1. Thus, the storage capacitor C1 charges and discharges to the threshold voltage of the sensing transistor M12 through the sensing transistor M12 having the diode configuration in response to switching of the level of the data line 120, so as to accomplish the compensation of the pixel circuit 100.

After the compensation period T21, the pixel circuit 100 enters a sensing period T22. During the sensing period T22, the pixel circuit 100 senses an incident energy E. Because there is no scanning pulse on the first scan line 110a or the second scan line 110b, the sensing transistor M12 and the reset transistor M11 are both turned off. Besides, an incident energy E is supplied to the sensing element 101. In the embodiment illustrated in FIG. 1A, the incident energy E is light energy. Namely, the incident energy E may be visible light or invisible light (for example, X ray). Additionally, the sensing element 101 may be a photodiode, a photoresistor, a photoconductor, or a phototransistor.

In another embodiment, the incident energy E may also be mechanical energy, and the sensing element 101 may be a mechanical energy sensor, such as a pressure sensor. In yet another embodiment, the incident energy E may also be thermal energy, and the sensing element 101 may be a temperature sensing element. Similarly, in still another embodiment, the incident energy E may also be any other type of detectable energy, and the sensing element 101 may be a corresponding sensor which is capable of sensing the detectable energy.

Thereby, the sensing element 101 transfers the incident energy E into a corresponding electric signal. For example, the sensing element 101 generates a corresponding sensing voltage according to the intensity of the incident energy E and stores the sensing voltage into the storage capacitor C1, so that the voltage VG1 at the control terminal of the sensing transistor M12 changes relatively. For example, during the sensing period T22, the falling speed of the voltage VG1 is proportional to the intensity of the incident energy E.

After the sensing period T22, the pixel circuit 100 enters a reading period T23. During the reading period T23, the pixel circuit 100 still cannot receive any scanning pulse from the first scan line 110a, and accordingly the reset transistor M11 is still turned off. Additionally, the pixel circuit 100 receives a second scanning pulse PU23 from the second scan line 110b. Thus, the sensing transistor M12 generates a corresponding sensing current in response to the second scanning pulse PU23 and the voltage stored in the storage capacitor C1. Moreover, during the reading period T23, the switch SW1 receives a pulse PU24 therefore is turned on. Thus, the reading circuit 130 receives the sensing current from the data line 120 through the turned-on switch SW1 and generates a corresponding sensing result according to the sensing current.

It should be mentioned that the sensing current generated by the sensing transistor M12 is proportional to the voltage difference ΔV between the voltage VG1 and the threshold voltage of the sensing transistor M12. Besides, the threshold voltage of the sensing transistor M12 is already stored in the storage capacitor C1 during the compensation period T21, and the voltage VG1 includes the voltage stored in the storage capacitor C1. Thus, the voltage difference ΔV is not affected by the threshold voltage of the sensing transistor M12. In other words, the pixel circuit 100 charges and discharges the storage capacitor C1 to the threshold voltage of the sensing transistor M12 during the compensation period T21 and drives the sensing transistor M12 by the second scanning pulse PU23 and the voltage stored in the storage capacitor C1 during the reading period T23. Accordingly, the sensing current generated by the sensing transistor M12 is not affected by the threshold voltage thereof, so that the sensing result generated by the reading circuit 130 is prevented from being affected by the threshold voltage of the transistor.

Figure 3:
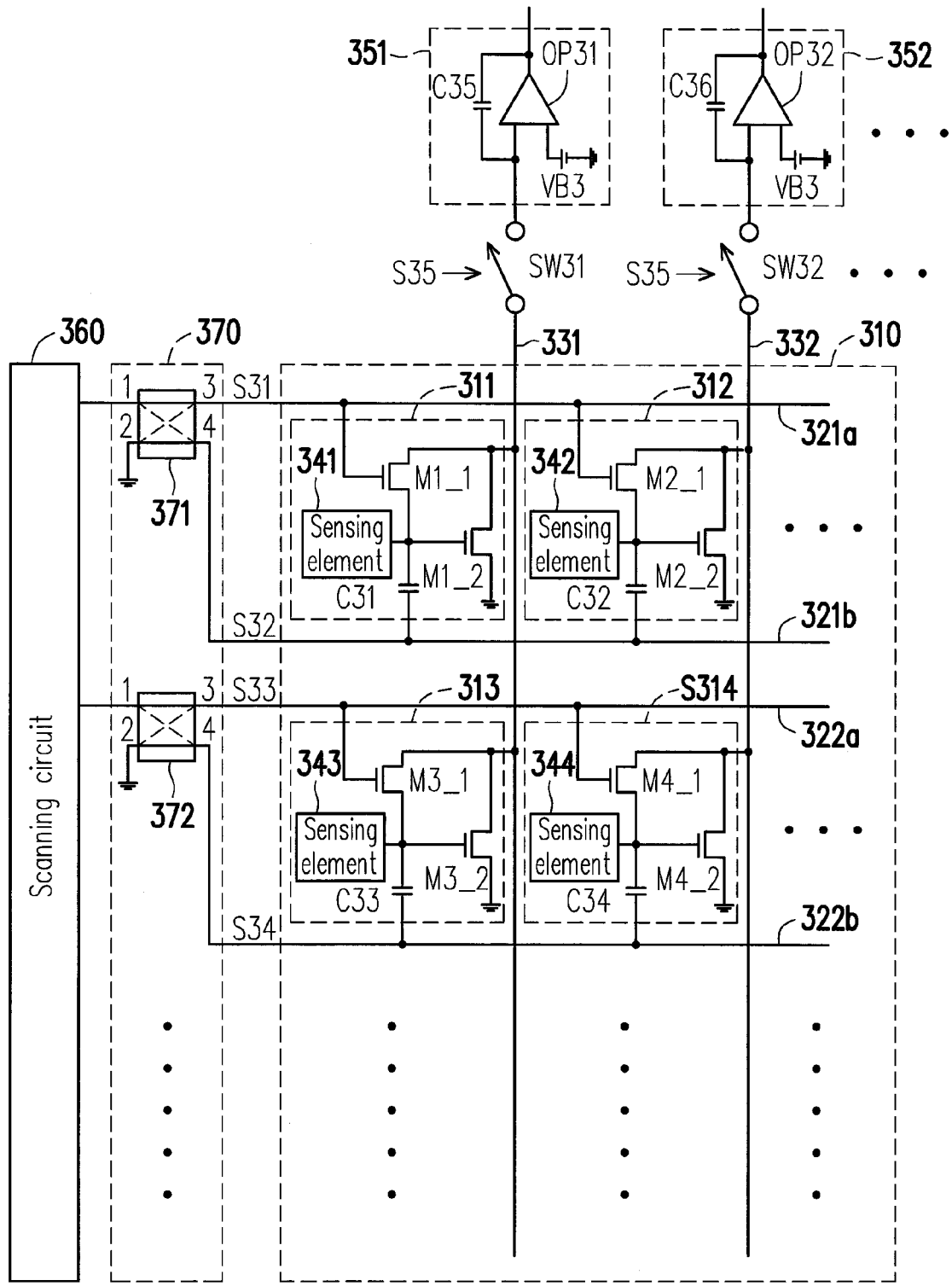
FIG. 3 is a diagram of a sensing device according to an exemplary embodiment of the disclosure.

FIG. 3 is a diagram of a sensing device according to an exemplary embodiment of the disclosure. Referring to FIG. 3, the sensing device 300 includes an active sensing array 310, and the active sensing array 310 includes a plurality of pixel circuits (for example, pixel circuits 311-314), a plurality of first scan lines (for example, first scan lines 321a and 322a), a plurality of second scan lines (for example, second scan lines 321b and 322b), and a plurality of data lines (for example, data lines 331 and 332). Each row of pixel circuits constitutes a pixel row and is corresponding to one of the first scan lines and one of the second scan lines. For example, the pixel circuits (for example, 311 and 312) in the first row constitute the first pixel row and are electrically connected to the first scan line 321a, the second scan line 321b, and the data lines. The pixel circuits (for example, 313 and 314) in the second row constitute the second pixel row and are electrically connected to the first scan line 322a, the second scan line 322b, and the data lines.

In other words, the active sensing array 310 includes M pixel rows, and the M pixel rows are corresponding to M first scan lines, M second scan lines, and a plurality of data lines. The $i^{th}$ pixel row is electrically connected to the $i^{th}$ first scan line, the $i^{th}$ second scan line, and the data lines, where M is a positive integer, i is an integer, and $1 \leq i \leq M$. In addition, each column of pixel circuits is corresponding to a data line. For example, the pixel circuits 311 and 313 in the first column are electrically connected to the data line 331, and the pixel circuits 312 and 314 in the second column are electrically connected to the data line 332.

In other words, each pixel circuit is electrically connected to a first scan line, a second scan line, and a data line. Besides, each pixel circuit in the active sensing array 310 has a circuit structure similar to that of the pixel circuit 100 illustrated in FIG. 1A. For example, the pixel circuit 311 includes a sensing element 341, a reset transistor M1_1, a sensing transistor M1_2, and a storage capacitor C31. The connection and detail operation of aforementioned elements can be referred to related descriptions of the sensing element 101, the reset transistor M11, the sensing transistor M12, and the storage capacitor C1 in FIG. 1A. Similarly, the connections and detail operations of the sensing elements 342-344, the reset transistors M2_1-M4_1, the sensing transistors M2_2-M4_2, and the storage capacitors C32-C34 in the pixel circuits 312-314 can be deduced by analogy.

The sensing device 300 further includes a plurality of switches (for example, switches SW31 and SW32), a plurality of reading circuits (for example, reading circuits 351 and 352), a scanning circuit 360 and a switching circuit 370. Each data line is electrically connected to one reading circuit through one switch. For example, the switch SW31 is electrically connected between the data line 331 and the reading circuit 351, and the switch SW32 is electrically connected between the data line 332 and the reading circuit 352.

Moreover, each reading circuit includes an operational amplifier and a capacitor. The reading circuit 351 includes an operational amplifier OP31 and a capacitor C35. The first input terminal of the operational amplifier OP31 is electrically connected to the first terminal of the switch SW31, and the second input terminal of the operational amplifier OP31 receives a bias voltage VB3. The first end of the capacitor C35 is electrically connected to the first input terminal of the operational amplifier OP31, and the second end of the capacitor C35 is electrically connected to the output terminal of the operational amplifier OP31. The operational amplifier OP31 and the capacitor C35 constitute an integrator. Thus, when the switch SW31 is turned on, the data line 331 is biased at the bias voltage VB3 through the reading circuit 351 and the reading circuit 351 integrates the sensing current from the data line 331 to generate a corresponding sensing result. Similarly, the reading circuit 352 includes an operational amplifier OP32 and a capacitor C36, and the circuit structure of the reading circuit 352 is similar to that of the reading circuit 351 therefore will not be repeated herein.

On the other hand, the switching circuit 370 is electrically connected between the scanning circuit 360 and the active sensing array 310 and includes a plurality of switching units (for example, switching units 371 and 372). Each switching unit includes four terminals 1-4. Taking the switching unit 371 as an example, the four terminals 1-4 thereof are electrically connected to a driving channel of the scanning circuit 360, the ground, the first scan line 321a, and the second scan line 321b respectively. Similarly, the four terminals 1-4 of the switching unit 372 are electrically connected to a driving channel of the scanning circuit 360, the ground, the first scan line 322a, and the second scan line 322b respectively. In addition, each switching unit has two states. In the first state, the first terminal 1 and the third terminal 3 of the switching unit are electrically connected with each other, and the second terminal 2 and the fourth terminal 4 of the switching unit are electrically connected with each other. In the second state, the first terminal 1 and the fourth terminal 4 of the switching unit are electrically connected with each other, and the second terminal 2 and the third terminal 3 of the switching unit are electrically connected with each other.

Figure 4:
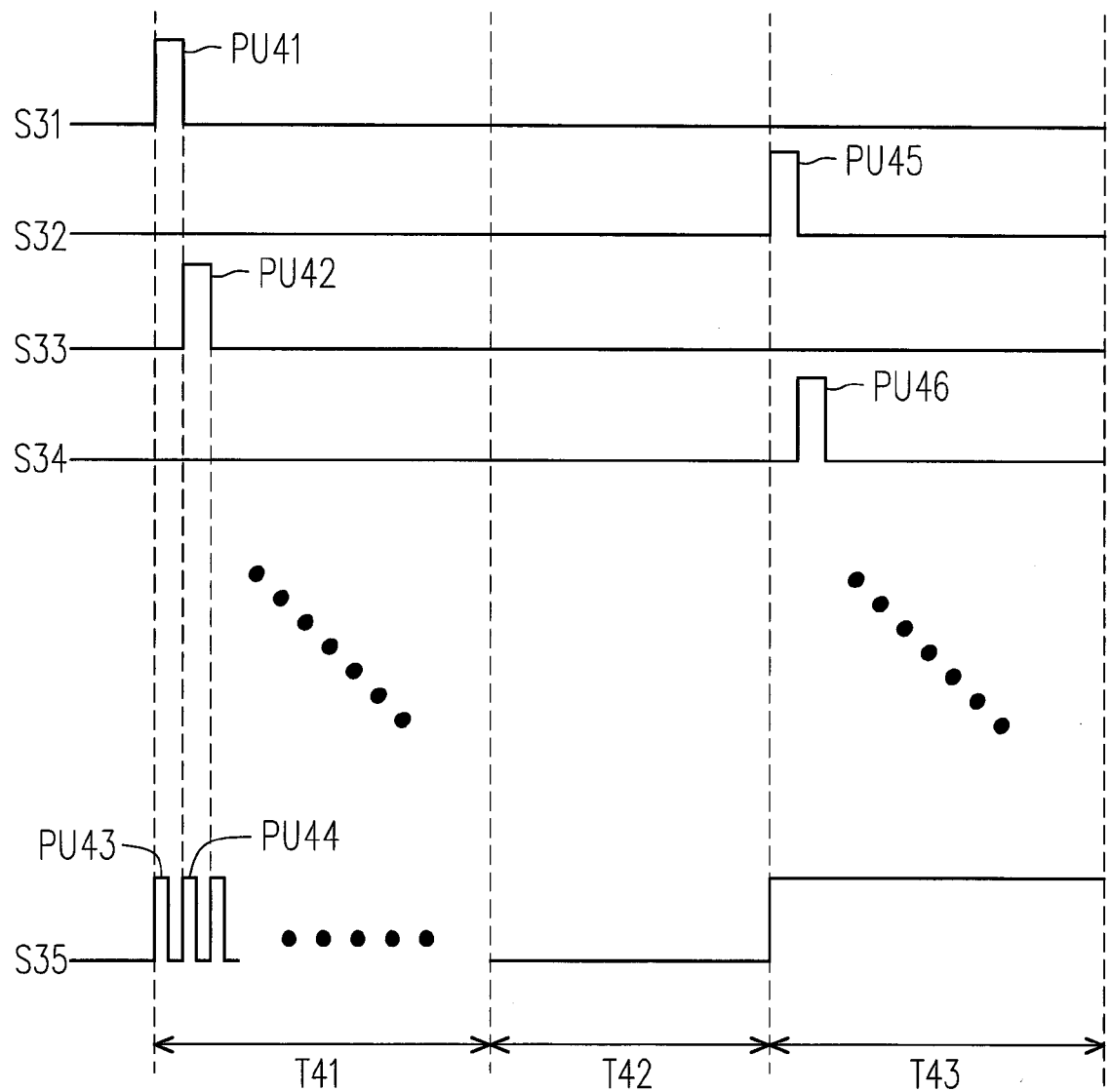
FIG. 4 is a signal timing diagram for illustrating a sensing device according to an exemplary embodiment of the disclosure.

FIG. 4 is a signal timing diagram for illustrating a sensing device according to an exemplary embodiment of the disclosure. In FIG. 3 and FIG. 4, the reference numerals S31 and S33 represent signals transmitted to the first scan lines 321a and 322a, the reference numerals S32 and S34 represent signals transmitted to the second scan lines 321b and 322b, and the reference numeral S35 represents a signal for controlling the switches SW31 and SW32. The operation of the sensing device 300 will be explained in detail with reference to the elements illustrated in FIG. 3 and the timing diagram in FIG. 4.

The pixel circuits 311-314 sequentially enter the compensation period T41, a sensing period T42, and a reading period T43. During the compensation period T41, the switching units 371 and 372 in the switching circuit 370 are switched to the first state, and the scanning circuit 360 sequentially transmits first scanning pulses PU41 and PU42. Thus, the first scan lines 321a and 322a respectively receive the first scanning pulses PU41 and PU42 through the switching circuit 370, and the second scan lines 321b and 322b are switched to the ground level.

The pixel circuits 311 and 312 in the first pixel row receive the first scanning pulse PU41 from the first scan line 321a, so that the reset transistors M1_1 and M2_1 are turned on. Namely, the reset transistors (for example, M1_1 and M2_1) in the first pixel row are turned on in response to the first scanning pulse PU41 from the $1^{st}$ first scan line 321a. When the reset transistors M1_1 and M2_1 are turned on, the sensing transistors M1_2 and M2_2 are connected into a diode configuration. Namely, the sensing transistors (for example, M1_2 and M2_2) in the first pixel row are connected into the diode configuration. Additionally, during the transmission period of the first scanning pulse PU41, the sensing device 300 first turns on the switches SW31 and SW32 by using the pulse PU43 and then turns off the switches SW31 and SW32.

In other words, during the transmission period of the first scanning pulse PU41, the switches SW31 and SW32 are sequentially turned on and off, so that the data lines 331 and 332 are sequentially switched to the bias voltage VB3 and the floating state. Correspondingly, along with the level change of the data lines 331 and 332, the storage capacitor C31 in the pixel circuit 311 charges and discharges to the threshold voltage of the sensing transistor M1_2, and the storage capacitor C32 in the pixel circuit 312 charges and discharges to the threshold voltage of the sensing transistor M2_2. Namely, the storage capacitors (for example, C31 and C32) in the first pixel row charge and discharge to the threshold voltage of the sensing transistor (for example, M1_2 and M2_2) having the diode configuration through the sensing transistors (for example, M1_2 and M2_2) having the diode configuration in the first pixel row in response to switching of the levels of the data lines.

Next, the pixel circuits 313 and 314 in the second pixel row receive the first scanning pulse PU42 from the first scan line 322*a*, so that the reset transistors M3_1 and M4_1 are turned on and accordingly the sensing transistors M3_2 and M4_2 are connected into the diode configuration. Namely, the reset transistors (for example, M3_1 and M4_1) in the second pixel row are turned on in response to the first scanning pulse PU42 from the first scan line 322*a*, so that the sensing transistors (for example, M3_2 and M4_2) in the second pixel row are respectively connected into the diode configuration.

During the period for transmitting the first scanning pulse PU42, the sensing device 300 first turns on the switches SW31 and SW32 by using the pulse PU44 and then turns off the switches SW31 and SW32. Thus, during the transmission period of the first scanning pulse PU42, the data lines 331 and 332 are sequentially switched to the bias voltage VB3 and the floating state. Along with the level change of the data lines 331 and 332, the storage capacitor C33 in the pixel circuit 313 charges and discharges to the threshold voltage of the sensing transistor M3_2, and the storage capacitor C34 in the pixel circuit 314 charges and discharges to the threshold voltage of the sensing transistor M4_2. Namely, the storage capacitors (for example, C33 and C34) in the second pixel row charge and discharge to the threshold voltages of the sensing transistors (for example, M3_2 and M4_2) having the diode configuration in the second pixel row through the sensing transistors (for example, M3_2 and M4_2) having the diode configuration in response to switching of the levels of the data lines.

In other words, during the compensation period T41, the sensing device 300 first compensates the pixel circuits (for example, 311 and 312) in the first pixel row and then compensates the pixel circuits (for example, 313 and 314) in the second pixel row. Accordingly, the pixel rows are compensated one by one during the compensation period T41. Thus, the storage capacitor in each pixel circuit charges and discharges to the threshold voltage of the sensing transistor during the compensation period T41.

Figure 5:
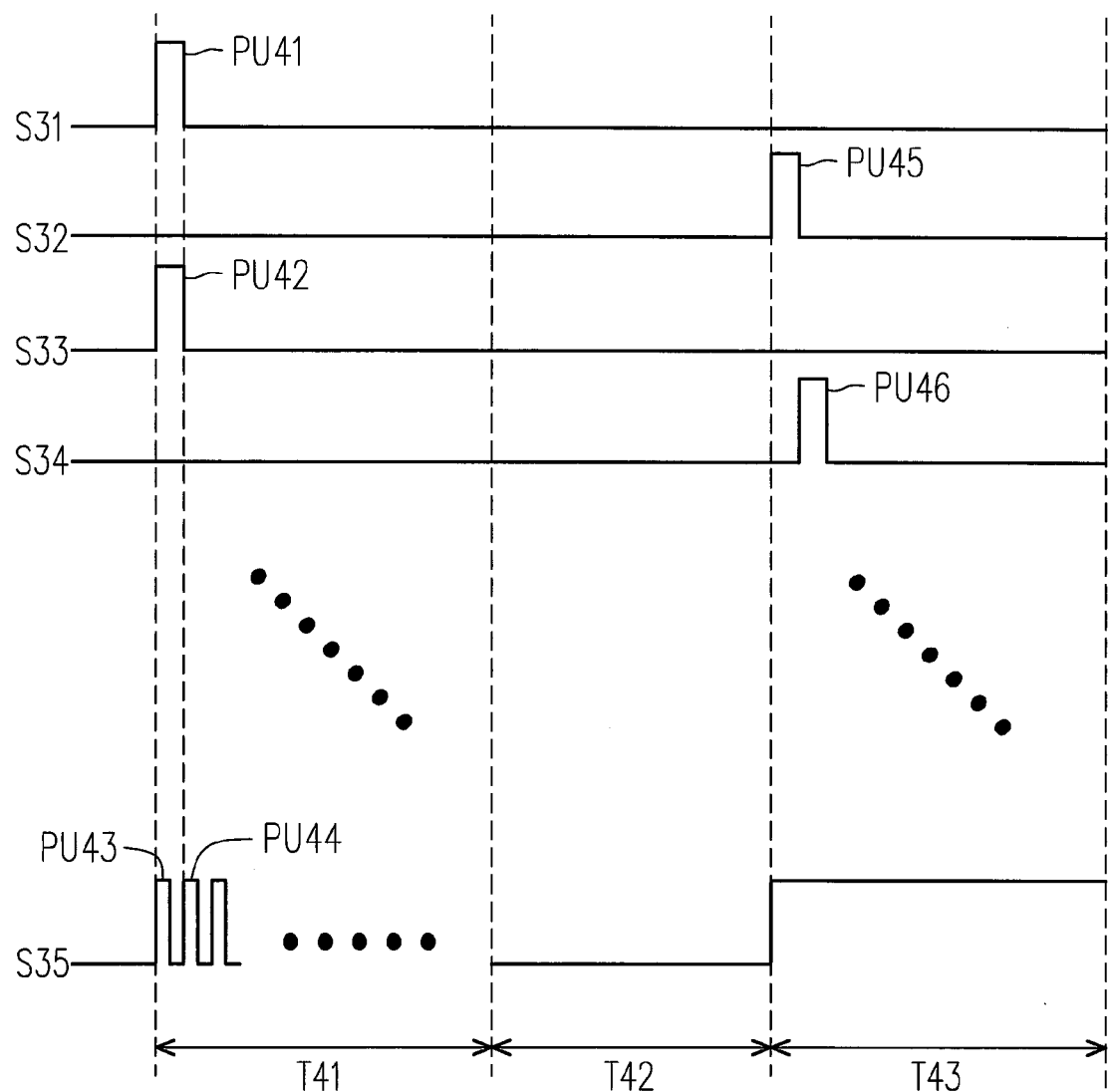
FIG. 5 is a signal timing diagram for illustrating a sensing device according to another exemplary embodiment of the disclosure.

It should be mentioned that the embodiment illustrated in FIG. 4 exemplarily describes the technique of compensating each pixel circuit during the compensation period T41 but is not intended to limit the scope of the disclosure. FIG. 5 is a signal timing diagram for illustrating a sensing device according to another exemplary embodiment of the disclosure. As shown in FIG. 5, during the compensation period T41, the first scanning pulses PU41 and PU42 are transmitted to the first scan lines 321*a* and 322*a* at the same time. Besides, during the period for transmitting both the first scanning pulses PU41 and PU42, the sensing device 300 first turns on the switches SW31 and SW32 by using the pulse PU43 and then turns off the switches SW31 and SW32. Thus, the sensing device 300 can compensate the pixel circuits 311-314 in the first and the second pixel rows at the same time.

Figure 6:
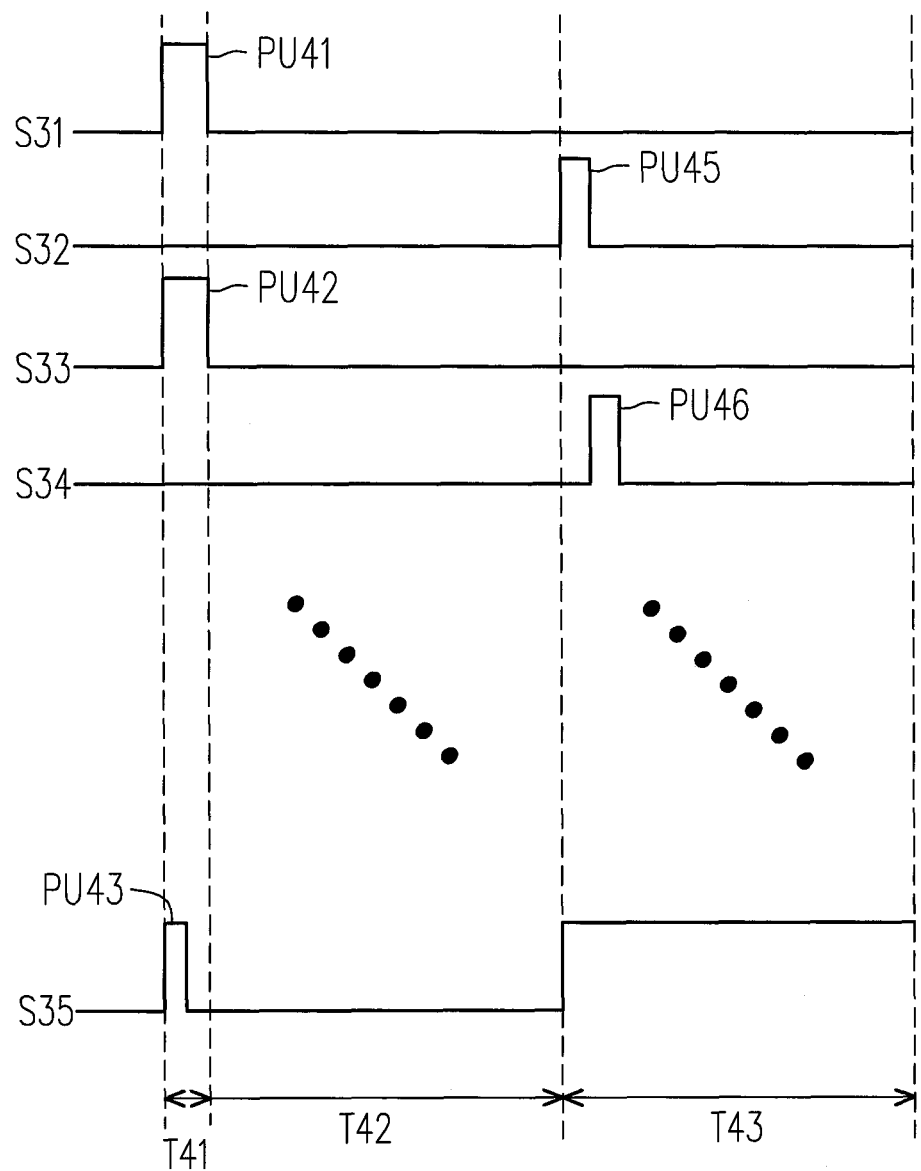
FIG. 6 is a signal timing diagram for illustrating a sensing device according to yet another exemplary embodiment of the disclosure.

In other words, in the embodiment illustrated in FIG. 5, every two pixel rows are regarded as a compensation block, and the sensing device 300 compensates the compensation blocks one by one during the compensation period T41. Similarly, in another embodiment, the $1^{st}$ to the $N^{th}$ pixel rows are considered a compensation block, where N is an integer not greater than M. Namely, the sensing device 300 can perform regional compensation on the pixel circuits in the active sensing array 310. In yet another embodiment, all the pixel circuits in the active sensing array 310 are regarded as a compensation block (i.e., the $1^{st}$ to the $M^{th}$ pixel rows are directly considered a compensation block). FIG. 6 is a signal timing diagram for illustrating a sensing device according to yet another exemplary embodiment of the disclosure. As shown in FIG. 6, during the compensation period T41, a first scanning pulse is transmitted to each first scan line at the same time, so that the sensing device 300 can perform a one-time compensation on all the pixel circuits. In other words, those skilled in the art can use the sensing device 300 to perform row-by-row compensation, regional compensation, or one-time compensation on the pixel circuits during the compensation period T41 according to the actual design requirement.

After the compensation period T41, the pixel circuits 311-314 enter the sensing period T42. During the sensing period T42, the switching units 371 and 372 in the switching circuit 370 remain in the first state. Besides, the scanning circuit 360 does not transmit any scanning pulse, so that the first scan lines 321*a* and 322*a* are switched to the ground level. Thus, the reset transistors M1_1-M4_1 and the sensing transistors M1_2-M4_2 in the pixel circuits 311-314 are all turned off. Besides, an incident energy is supplied to the pixel circuits 311-314. Thus, the sensing elements 341-344 respectively generate corresponding sensing voltages according to the intensity of the incident energy and store the sensing voltages into the storage capacitors C31-C34. Namely, during the sensing period T42, the sensing transistors (for example, M1_2-M4_2) and the reset transistors (for example, M1_1-M4_1) in the M pixel rows are all turned off, and the sensing elements (for example, 341-344) in the M pixel rows respectively sense a incident energy and store the sensing voltages into the storage capacitors (for example, C31-C34) in the M pixel rows.

After the sensing period T42, the pixel circuits 311-314 enter the reading period T43. During the reading period T43, the switching units 371 and 372 in the switching circuit 370 are switched to the second state, and the scanning circuit 360 sequentially transmits the second scanning pulses PU45 and PU46. Thus, the second scan lines 321*b* and 322*b* respectively receive the second scanning pulses PU45 and PU46 through the switching circuit 370, and the first scan lines 321*a* and 322*a* are switched to the ground level. Additionally, the switches SW31 and SW32 receive the signal S35 with high-level therefore are turned on.

Accordingly, the pixel circuits 311 and 312 in the first pixel row receive the second scanning pulse PU45 from the second scan line 321*b*. Then the sensing transistor M1_2 in the pixel circuit 311 generates a corresponding sensing current in response to the second scanning pulse PU45 and the voltage stored in the storage capacitor C31. Besides, the sensing transistor M2_2 in the pixel circuit 312 generates a corresponding sensing current in response to the second scanning pulse PU45 and the voltage stored in the storage capacitor C32.

Thereafter, the pixel circuits 313 and 314 in the second pixel row receive the second scanning pulse PU46 from the second scan line 322*b*. Then, the sensing transistor M3_2 in the pixel circuit 313 generates a corresponding sensing current in response to the second scanning pulse PU46 and the voltage stored in the storage capacitor C33. Besides, the sensing transistor M4_2 in the pixel circuit 314 generates a corresponding sensing current in response to the second scanning pulse PU46 and the voltage stored in the storage capacitor C34.

In other words, during the reading period T43, each pixel row generates the corresponding sensing currents. Namely, during a reading period, the reset transistors (for example, M1_1-M4_1) of the M pixel rows are turned off, and the M pixel rows sequentially receive M second scanning pulses (for example, PU45 and PU46) from the M second scan lines (for example, 321*b* and 322*b*), wherein the sensing transistors in the $i^{th}$ pixel row generate a plurality of sensing currents in response to the second scanning pulse from the i$^{th}$ second scan line and the voltages stored in the storage capacitors in the i$^{th}$ pixel row. Besides, the reading circuits 351-352 receive the sensing currents from the data lines 331-332 through the turned-on switches SW31-SW32 and generate corresponding sensing results according to the sensing currents.

It should be mentioned that because each pixel circuit has been compensated during the compensation period T41, the sensing currents generated by each pixel circuit are not affected by the threshold voltages of the transistors. Thereby, when the resolution and sensitivity of the sensing device 300 are increased, the characteristic differences between different elements (for example, different transistors have different threshold voltages due to process variations) do not affect the sensing device 300 even though the electric signals generated by the pixel circuits are weak. In addition, each pixel circuit is composed of two transistors and one storage capacitor. In other words, each pixel circuit has a simple circuit structure so as to facilitate the miniaturization development of the sensing device 300.

As described above, in a pixel circuit provided by an exemplary embodiment of the disclosure, a storage capacitor charges and discharges to a threshold voltage of a sensing transistor during a compensation period, and the sensing transistor is driven by a scanning pulse and the voltage stored in the storage capacitor during a reading period. Thus, the sensing current generated by the sensing transistor is not affected by the threshold voltage thereof, and accordingly, any sensing error caused by characteristic differences between different elements is avoided. Moreover, the pixel circuit in the disclosure adopts a 2-transistor (2T) structure so as to facilitate the miniaturization development of the active sensing array.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A pixel circuit, electrically connected to a first scan line, a second scan line, and a data line, the pixel circuit comprising:
    a sensing transistor, electrically connected to a sensing element and the data line;
    a reset transistor, electrically connected to the first scan line and the sensing transistor; and
    a storage capacitor, electrically connected to the sensing transistor and the second scan line, wherein during a compensation period, the reset transistor is turned on in response to a first scanning pulse from the first scan line, so that the sensing transistor is connected into a diode configuration, and the storage capacitor charges and discharges to a threshold voltage of the sensing transistor through the sensing transistor having the diode configuration in response to switching of a level of the data line, during the compensation period, the data line is sequentially switched to a bias voltage and a floating state, when the data line is switched to the bias voltage, the storage capacitor charges to the bias voltage through the sensing transistor having the diode configuration, and when the data line is switched to the floating state, the storage capacitor discharges to the threshold voltage of the sensing transistor through the sensing transistor having the diode configuration.

2. The pixel circuit according to claim 1, wherein the data line is electrically connected to a reading circuit through a switch, and during the compensation period, the switch is sequentially turned on and turned off, wherein when the switch is turned on, the data line is switched to the bias voltage, and when the switch is turned off, the data line is switched to the floating state.

3. The pixel circuit according to claim 1, wherein during a sensing period, the sensing transistor and the reset transistor are turned off, and the sensing element senses an incident energy and stores a sensing voltage into the storage capacitor.

4. The pixel circuit according to claim 1, wherein during a reading period, the reset transistor is turned off, and the sensing transistor generates a sensing current in response to a second scanning pulse from the second scan line and a voltage stored in the storage capacitor.

5. The pixel circuit according to claim 1, wherein the sensing transistor has a first terminal, a second terminal, and a control terminal, wherein the first terminal of the sensing transistor is electrically connected to the data line, the second terminal of the sensing transistor is electrically connected to a ground, the control terminal of the sensing transistor is electrically connected to the sensing element and a first end of the storage capacitor, and a second end of the storage capacitor is electrically connected to the second scan line.

6. The pixel circuit according to claim 5, wherein the reset transistor has a first terminal, a second terminal, and a control terminal, wherein the first terminal of the reset transistor is electrically connected to the first terminal of the sensing transistor, the second terminal of the reset transistor is electrically connected to the control terminal of the sensing transistor, and the control terminal of the reset transistor is electrically connected to the first scan line.

7. The pixel circuit according to claim 1, wherein the sensing element is disposed inside or outside the pixel circuit, or the sensing element is stacked on the pixel circuit.

8. A driving method of a pixel circuit, wherein the pixel circuit comprises a sensing transistor, a reset transistor, and a storage capacitor, the driving method comprising:
    electrically connecting the pixel circuit through a data line, a first scan line, and a second scan line, wherein the sensing transistor is electrically connected to a sensing element and the data line, the reset transistor is electrically connected to the first scan line and the sensing transistor, and the storage capacitor is electrically connected to the sensing transistor and the second scan line;
    during a compensation period, providing a first scanning pulse to the first scan line to turn on the reset transistor;
    connecting the sensing transistor into a diode configuration through the turned-on reset transistor; and
    switching a level of the data line, so that the storage capacitor charges and discharges to a threshold voltage of the sensing transistor through the sensing transistor having the diode configuration, wherein the step of switching the level of the data line so that the storage capacitor charges and discharges to the threshold voltage of the sensing transistor through the sensing transistor having the diode configuration comprises:
    during the compensation period, sequentially switching the data line to a bias voltage and a floating state, wherein when the data line is switched to the bias voltage, the storage capacitor charges to the bias voltage through the sensing transistor having the diode configuration, and when the data line is switched to the floating state, the storage capacitor discharges to the threshold voltage of the sensing transistor through the sensing transistor having the diode configuration.

9. The driving method according to claim 8, wherein the step of electrically connecting the pixel circuit through the data line, the first scan line, and the second scan line comprises:
  electrically connecting a first terminal of the sensing transistor and a first terminal of the reset transistor through the data line, wherein a second terminal of the sensing transistor is electrically connected to a ground, and a second terminal of the reset transistor is electrically connected to a control terminal of the sensing transistor, a first end of the storage capacitor, and the sensing element;
  electrically connecting a control terminal of the reset transistor through the first scan line; and
  electrically connecting a second end of the storage capacitor through the second scan line.

10. The driving method according to claim 8, wherein the step of sequentially switching the data line to the bias voltage and the floating state during the compensation period comprises:
  disposing a switch between the data line and a reading circuit; and
  during the compensation period, sequentially turning on and off the switch, wherein when the switch is turned on, the data line is switched to the bias voltage, and when the switch is turned off, the data line is switched to the floating state.

11. The driving method according to claim 8 further comprising:
  during a sensing period, turning off the sensing transistor and the reset transistor, sensing an incident energy through the sensing element, and storing a sensing voltage into the storage capacitor.

12. The driving method according to claim 8 further comprising:
  during a reading period, turning off the reset transistor, and providing a second scanning pulse to the second scan line, so that the sensing transistor generates a sensing current in response to the second scanning pulse and a voltage stored in the storage capacitor.

13. An active sensing array, comprising:
  M pixel rows, corresponding to M first scan lines, M second scan lines, and a plurality of data lines, wherein an $i^{th}$ pixel row is electrically connected to an $i^{th}$ first scan line, an $i^{th}$ second scan line, and the data lines, M is a positive integer, i is an integer, $1 \leq I \leq M$, the $i^{th}$ pixel row comprises a plurality of pixel circuits, and each of the pixel circuits of the $i^{th}$ pixel row comprises:
  a sensing transistor, electrically connected to a sensing element and one of the data lines;
  a reset transistor, electrically connected to the $i^{th}$ first scan line and the sensing transistor; and
  a storage capacitor, electrically connected to the sensing transistor and the $i^{th}$ second scan line,
  wherein during a compensation period, the reset transistors of the $1^{st}$ to the $N^{th}$ pixel rows are turned on in response to N first scanning pulses from the $1^{st}$ to the $N^{th}$ first scan lines, so that the sensing transistors of the $1^{st}$ to the $N^{th}$ pixel rows are respectively connected into a diode configuration, wherein N is an integer not greater than M, and during the compensation period, the storage capacitors of the $1^{st}$ to the $N^{th}$ pixel rows charge and discharge to threshold voltages of the sensing transistors having the diode configuration of the $1^{st}$ to the $N^{th}$ pixel rows through the sensing transistors having the diode configuration in response to switching of levels of the data lines,
  during the compensation period, the data lines are sequentially switched to a bias voltage and a floating state, wherein when the data lines are switched to the bias voltage, the storage capacitors of the $1^{st}$ to the $N^{th}$ pixel rows respectively charge to the bias voltage through the sensing transistors having the diode configuration, and when the data lines are switched to the floating state, the storage capacitors of the $1^{st}$ to the $N^{th}$ pixel rows discharge to the threshold voltages of the sensing transistors having the diode configuration through the sensing transistors having the diode configuration.

14. The active sensing array according to claim 13, wherein the data lines are electrically connected to a plurality of reading circuits through a plurality of switches, and during the compensation period, the switches are sequentially turned on and off, wherein when the switches are turned on, the data lines are switched to the bias voltage, and when the switches are turned off, the data lines are switched to the floating state.

15. The active sensing array according to claim 13, wherein during a sensing period, the sensing transistors and the reset transistors of the M pixel rows are all turned off, and the sensing elements of the M pixel rows respectively sense an incident energy and store a plurality of sensing voltages into the storage capacitors of the M pixel rows.

16. The active sensing array according to claim 13, wherein during a reading period, the reset transistors of the M pixel rows are turned off, and the M pixel rows sequentially receive M second scanning pulses from the M second scan lines, wherein the sensing transistors of the $i^{th}$ pixel row generate a plurality of sensing currents in response to the second scanning pulse from the $i^{th}$ second scan line and voltages stored in the storage capacitors of the $i^{th}$ pixel row.

17. The active sensing array according to claim 13, wherein the sensing transistor has a first terminal, a second tee and a control terminal, wherein the first terminal of the sensing transistor is electrically connected to the one of the data lines, the second terminal of the sensing transistor is electrically connected to a ground, the control terminal of the sensing transistor is electrically connected to the sensing element and a first end of the storage capacitor, and a second end of the storage capacitor is electrically connected to the $i^{th}$ second scan line.

18. The active sensing array according to claim 17, wherein the reset transistor has a first terminal, a second terminal, and a control terminal, wherein the first terminal of the reset transistor is electrically connected to the first terminal of the sensing transistor, the second terminal of the reset transistor is electrically connected to the control terminal of the sensing transistor, and the control terminal of the reset transistor is electrically connected to the $i^{th}$ first scan line.

19. The active sensing array according to claim 13, wherein the sensing element is disposed inside or outside the corresponding pixel circuit, or the sensing element is stacked on the corresponding pixel circuit.

20. A driving method of an active sensing array, wherein the active sensing array comprises M pixel rows, an $i^{th}$ pixel row comprises a plurality of pixel circuits, and each of the pixel circuits comprises a sensing transistor, a reset transistor, and a storage capacitor, M is a positive integer, i is an integer, and $1 \leq i \leq M$, the driving method comprising:
  electrically connecting the M pixel rows through M first scan lines, M second scan lines, and a plurality of data lines, wherein the $i^{th}$ pixel row is electrically connected to an $i^{th}$ first scan line, an $i^{th}$ second scan line, and the data lines;

during a compensation period, providing N first scanning pulses to the $1^{st}$ to the $N^{th}$ first scan lines to turn on the reset transistors of the $1^{st}$ to the $N^{th}$ pixel rows, wherein N is an integer not greater than M;

respectively connecting the sensing transistors of the $1^{st}$ to the $N^{th}$ pixel rows into a diode configuration through the turned-on reset transistors of the $1^{st}$ to the $N^{th}$ pixel rows; and switching levels of the data lines, so that the storage capacitors of the $1^{st}$ to the $N^{th}$ pixel roves charge and discharge to threshold voltages of the sensing transistors having the diode configuration through the sensing transistors having the diode configuration, wherein the step of switching the levels of the data lines so that the storage capacitors of the $1^{st}$ to the $N^{th}$ pixel rows charge and discharge to the threshold voltages of the sensing transistors having the diode configuration through the sensing transistors having the diode configuration comprises:

during the compensation period, sequentially switching the data lines to a bias voltage and a floating state, wherein when the data lines are switched to the bias voltage, the storage capacitors of the $1^{st}$ to the $N^{th}$ pixel rows charge to the bias voltage through the sensing transistors having the diode configuration, and when the data lines are switched to the floating state, the storage capacitors of the $1^{st}$ to the $N^{th}$ pixel rows discharge to the threshold voltages of the sensing transistors having the diode configuration through the sensing transistors having the diode configuration.

21. The driving method according to claim 20, wherein the step of sequentially switching the data lines to the bias voltage and the floating state during the compensation period comprises:

disposing a plurality of switches between the data lines and a plurality of reading circuits; and during the compensation period, sequentially turning on and off the switches, wherein when the switches are turned on, the data lines are switched to the bias voltage, and when the switches are turned off, the data lines are switched to the floating state.

22. The driving method according to claim 20 further comprising:

during a sensing period, turning off the sensing transistors and the reset transistors of the M pixel rows, sensing an incident energy through the sensing elements of the M pixel rows and storing a plurality of sensing voltages into the storage capacitors of the M pixel rows.

23. The driving method according to claim 20 further comprising:

during a reading period, turning off the reset transistors of the M pixel rows, and sequentially providing M second scanning pulses to the M second scan lines, so that the sensing transistors of the $i^{th}$ pixel row generate a plurality of sensing currents in response to the second scanning pulse from the $i^{th}$ second scan line and voltages stored in the storage capacitors of the $i^{th}$ pixel row.

24. A sensing device, comprising:
at least one sensing element; and
an active sensing array, comprising at least one pixel circuit, wherein the at least one pixel circuit is electrically connected to a first scan line, a second scan line, and a data line and comprises:
a sensing transistor, electrically connected to the at least one sensing element and the data line;
a reset transistor, electrically connected to the first scan line and the sensing transistor; and
a storage capacitor, electrically connected to the sensing transistor and the second scan line,
wherein during a compensation period, the reset transistor is turned on in response to a first scanning pulse from the first scan line, so that the sensing transistor is connected into a diode configuration, and the storage capacitor charges and discharges to a threshold voltage of the sensing transistor through the sensing transistor having the diode configuration in response to switching of a level of the data line, during the compensation period, the data line is sequentially switched to a bias voltage and a floating state, when the data line is switched to the bias voltage, the storage capacitor charges to the bias voltage through the sensing transistor having the diode configuration, and when the data line is switched to the floating state, the storage capacitor discharges to the threshold voltage of the sensing transistor through the sensing transistor having the diode configuration.

25. The sensing device according to claim 24 further comprising:
a reading circuit; and
a switch, having a first terminal electrically connected to the reading circuit and a second terminal electrically connected to the data line,
wherein during the compensation period, the sensing device sequentially turns on and off the switch so that the data line is sequentially switched to a bias voltage and a floating state.

26. The sensing device according to claim 25, wherein during a sensing period, the sensing device turns off the sensing transistor, the reset transistor, and the switch, and the at least one sensing element senses an incident energy and stores a sensing voltage into the storage capacitor.

27. The sensing device according to claim 25, wherein during a reading period, the sensing device turns off the reset transistor and turns on the switch, and the sensing transistor generates a sensing current in response to a second scanning pulse from the second scan line and a voltage stored in the storage capacitor.

28. The sensing device according to claim 25, wherein the reading circuit comprises:
an operational amplifier, having a first input terminal electrically connected to the first terminal of the switch and a second input terminal for receiving the bias voltage; and
a capacitor, having a first end electrically connected to the first input terminal of the operational amplifier and a second end electrically connected to an output terminal of the operational amplifier.

29. The sensing device according to claim 24, wherein the sensing transistor has a first terminal, a second terminal, and a control terminal, wherein the first terminal of the sensing transistor is electrically connected to the data line, the second terminal of the sensing transistor is electrically connected to a ground, the control terminal of the sensing transistor is electrically connected to the at least one sensing element and a first end of the storage capacitor, and a second end of the storage capacitor is electrically connected to the second scan line.

30. The sensing device according to claim 24, wherein the reset transistor has a first terminal, a second terminal, and a control terminal, wherein the first terminal of the reset transistor is electrically connected to the first terminal of the sensing transistor, the second terminal of the reset transistor is electrically connected to the control terminal of the sensing transistor, and the control terminal of the reset transistor is electrically connected to the first scan line.

31. The sensing device according to claim 24 further comprising:
- a scanning circuit; and
- a switching circuit, comprising a switching unit having a first terminal, a second terminal, a third terminal, and a fourth terminal, wherein the first terminal and the second terminal of the switching unit are electrically connected to a driving channel of the scanning circuit and a ground respectively, and the third terminal and the fourth terminal of the switching unit are electrically connected to the first scan line and the second scan line respectively,
- wherein during the compensation period, the scanning circuit generates the first scanning pulse, and the sensing device switches the switching circuit to a first state, so that the first terminal and the third terminal of the switching unit are electrically connected with each other, and the second terminal and the fourth terminal of the switching unit are electrically connected with each other.

32. The sensing device according to claim 31, wherein during a sensing period, the scanning circuit stops generating the first scanning pulse, and the sensing device maintains the switching circuit in the first state.

33. The sensing device according to claim 31, wherein during a reading period, the scanning circuit generates a second scanning pulse, and the sensing device switches the switching circuit to a second state, so that the first terminal and the fourth terminal of the switching unit are electrically connected with each other, and the second terminal and the third terminal of the switching unit are electrically connected with each other.

34. The sensing device according to claim 24, wherein the at least one sensing element is disposed inside or outside the at least one pixel circuit, or the at least one sensing element is stacked on the at least one pixel circuit.

* * * * *